US006578166B1

(12) United States Patent
Williams

(10) Patent No.: US 6,578,166 B1
(45) Date of Patent: Jun. 10, 2003

(54) RESTRICTING THE DAMAGING EFFECTS OF SOFTWARE FAULTS ON TEST AND CONFIGURATION CIRCUITRY

(75) Inventor: Emrys J. Williams, Palo Alto, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 09/501,547

(22) Filed: Feb. 9, 2000

(51) Int. Cl.[7] .............................................. G01R 31/28
(52) U.S. Cl. ....................................................... 714/726
(58) Field of Search ................................ 714/726, 727, 714/729; 326/16

(56) References Cited

U.S. PATENT DOCUMENTS

| 4,947,357 A | * | 8/1990 | Stewart et al. | 714/726 |
| 5,260,947 A | * | 11/1993 | Posse | 714/727 |
| 5,270,642 A | * | 12/1993 | Parker | 714/727 |
| 5,701,307 A | * | 12/1997 | Whetsel | 714/29 |
| 5,715,256 A | * | 2/1998 | Mohd et al. | 714/726 |
| 5,841,788 A | * | 11/1998 | Ke | 714/726 |
| 5,859,860 A | * | 1/1999 | Whetsel | 714/727 |
| 6,260,165 B1 | * | 7/2001 | Whetsel | 714/727 |

* cited by examiner

*Primary Examiner*—Albert Decady
*Assistant Examiner*—Joseph D. Torres
(74) *Attorney, Agent, or Firm*—Park, Vaughan & Fleming LLP

(57) ABSTRACT

A system that restricts the damaging effects of software faults that interact with test and configuration circuitry. This test and configuration circuitry includes a scan chain in the form of a serial linkage between memory elements within a circuit, thereby allowing a test input to be serially shifted into the memory elements. The system operates by receiving a test disable signal at the circuit. In response to the test disable signal, the system moves the circuit into a test disable mode, which limits any damaging effects to the circuit caused by shifting the test input into the memory elements in the scan chain. Next, the system shifts the test input into the memory elements in the scan chain. The system also determines whether the test input will cause damage to the circuit after the test input is completely shifted into the scan chain. If so, the system holds the circuit in the test disable mode so that the test input cannot damage the circuit. If not, the system moves the circuit out of test disable mode, and runs the circuit for at least one clock cycle in order to test the circuit.

29 Claims, 5 Drawing Sheets

RESTRICTING THE DAMAGING EFFECTS OF SOFTWARE FAULTS ON TEST AND CONFIGURATION CIRCUITRY

BACKGROUND

1. Field of the Invention

The present invention relates to circuitry for hardware test and configuration and fault-tolerance. More specifically, the present invention relates to a method and an apparatus for restricting the damaging effects of software faults that interact with hardware test and configuration circuitry within a computer system.

2. Related Art

It has been a long held convention in computer system design that one should not design hardware which can be damaged by software—no matter how faulty or malicious the software is. If a system is not designed in this way, it is hard to ensure overall system reliability because software commonly fails in unpredictable ways.

This convention is generally adhered to in designing most circuitry within a computer system. However, the convention is not generally followed for test scan circuitry. Test scan circuitry is typically incorporated into a circuit, such as a microprocessor chip, for testing purposes. Test scan allows test inputs to be scanned into memory elements within the circuit by coupling the memory elements together into one or more "scan chains." These scan chains act as long shift registers for scanning in test inputs and scanning out test outputs.

For example, referring to the circuitry illustrated in FIG. 1, when test mode signal 102 is asserted, multiplexers 110–112 connect memory elements (D-flip-flops) 120–122 into a shift register. This allows test inputs 104 to be shifted into memory elements 120–122. Note that when test mode signal 102 is not asserted, multiplexers 110–112 feed normal inputs 101 into memory elements 120–122.

The circuitry illustrated in FIG. 1 also includes multiplexer 113, which enables the circuit to switch between a test clock signal 108 and a main clock signal 106.

During testing, the circuit illustrated in FIG. 1 operates generally as follows. The circuit is first moved into a test mode by asserting select test clock signal 105 so that it selects test clock signal 108, and by asserting test mode signal 102. Next, inputs 104 are scanned into memory elements 120–122 using test clock signal 108. Then the circuit is moved out of the test mode by negating test mode signal 102, and the circuit is clocked with test clock signal 108 for one or more clock cycles. Finally, the circuit is moved back into test mode by asserting test mode signal 102, and the contents of memory elements 120–122 are scanned out of the circuit. Testing a circuit in this way enables system designers to see how the internal memory elements within the circuit change for different test inputs.

A problem can arise if faulty test software scans in a data pattern that can damage the circuit. For example, suppose that the test software scans ones into each of memory elements 120–122. This causes the outputs of memory elements 120–122 to activate drivers 140–142 through AND gates 170–172, respectively, at the same time causing a potential bus conflict on common bus line 160. This bus conflict is likely to damage at least one of drivers 140–142.

Note that this problem is to be avoided while test inputs 104 are being shifted into memory elements 120–122 by asserting test disable signal 109. Test disable signal 109 deactivates AND gates 170–172 preventing drivers 140–142, respectively, from being enabled. However, test disable signal 109 must be de-asserted in order to operate the circuitry normally for one or more clock cycles in order to perform the test. Hence, if the wrong values are stored in memory elements 120–122 they can damage drivers 140–142.

The problem of damaging circuitry during testing is, not a serious problem when the testing is being performed in the lab or on a production line, because damaged circuitry can be replaced before it is shipped to the consumer, and the test software is restricted to controlled test rigs. On the other hand, damaging circuitry during testing becomes a major problem when the testing occurs after the computer system is installed at a customer's site.

It is becoming more common for scan software to be deployed in a customer system in the field so that service processors can automatically diagnose a problem in the customer system. This makes it possible to automatically reconfigure the customer system in the field to correct the problem. Unfortunately, complex scan software in service processors can easily suffer from bugs, which can damage the circuitry within the customer's system. Hence, using scan software in the field can be undesirable because it can reduce system reliability.

What is needed is a method and an apparatus that prevents faulty scan test software from damaging the long-term reliability of a computer system's circuitry.

SUMMARY

One embodiment of the present invention provides a system that restricts the damaging effects of software faults that interact with test and configuration circuitry. This test and configuration circuitry includes a scan chain in the form of a serial linkage between memory elements within a circuit, thereby allowing a test input to be serially shifted into the memory elements. The system operates by receiving a test disable signal at the circuit. In response to the test disable signal, the system moves the circuit into a test disable mode, which limits any damaging effects to the circuit caused by shifting the test input into the memory elements in the scan chain. Next, the system shifts the test input into the memory elements in the scan chain. The system also determines whether the test input will cause damage to the circuit after the test input is completely shifted into the scan chain. If so, the system holds the circuit in the test disable mode so that the test input cannot damage the circuit. If not, the system moves the circuit out of test disable mode, and runs the circuit for at least one clock cycle in order to test the circuit.

In a variation on the above embodiment, the system determines whether the test input will cause damage to the circuit by examining the test input as the test input is shifted into the scan chain. This variation includes a state machine that looks for a pattern in the test input that will cause damage to the circuit.

In another variation, the system determines whether the test input will cause damage to the circuit by examining the test input after the test input is shifted into the scan chain by using a logic circuit that looks for a pattern in the scan chain that will cause damage to the circuit.

In one embodiment of the present invention, the test disable mode prevents more than one driver from driving a signal line at the same time in order to prevent conflicts between drivers.

In one embodiment of the present invention, after testing the circuit the system moves the circuit back into the test disable mode, and shifts a test output out of the scan chain. This test output can be examined to determine how the circuit performed during the test. In a variation on this embodiment, the scan chain includes a memory element that indicates whether the test input will cause damage to the circuit. This enables the system to determine whether the circuit moved out of the test disable mode during the test by examining the test output.

In one embodiment of the present invention, the test disable signal and the test input are received from a test controller which is located outside of the circuit.

In one embodiment of the present invention, the circuit can be operated using either a system clock or a test clock.

In one embodiment of the present invention, the circuit includes more than one scan chain.

In one embodiment of the present invention, the circuit resides within a single semiconductor chip.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Computer System

Figure 1:
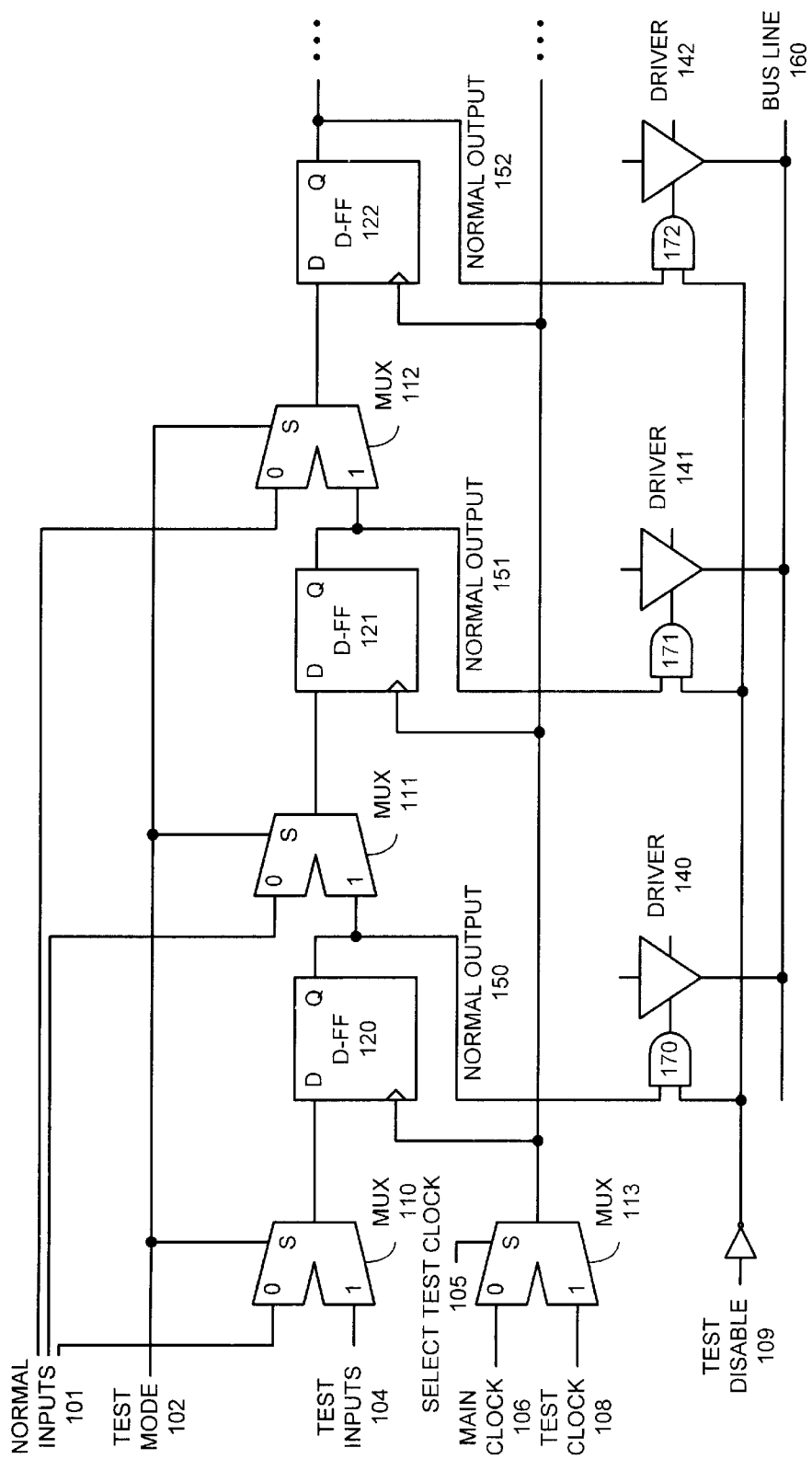
FIG. 1 illustrates an example of scan test circuitry in accordance with the prior art.
Figure 2:
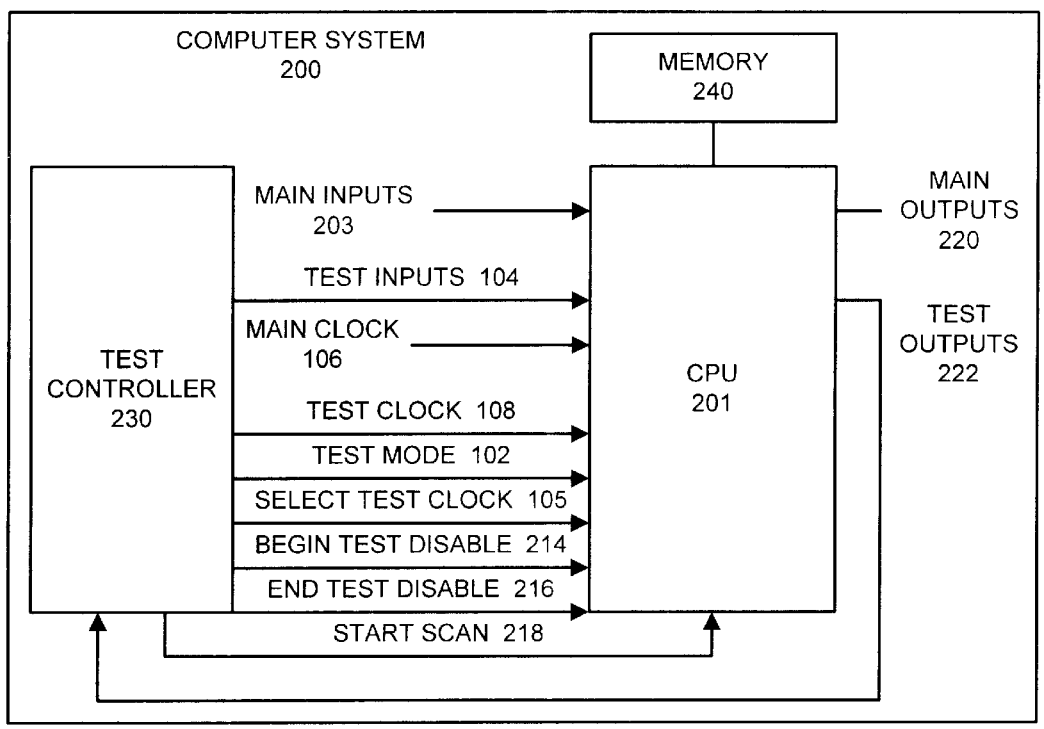
FIG. 2 illustrates a computer system including scan test circuitry in accordance with an embodiment of the present invention.

FIG. 2 illustrates a computer system 200 including scan test circuitry in accordance with an embodiment of the present invention. Computer system 200 can include any type of computer system built around a general purpose or special purpose processor, including, but not limited to, a microprocessor, a mainframe computer, a digital signal processor, a personal organizer and a device controller. Computer system 200 includes central processing unit (CPU) 201. CPU 201 receives main inputs 203 from other components in computer system 200 and produces main outputs 220, which are directed to other components in computer system 200. CPU 201 generally operates under control of main clock signal 106. Note that the present invention can generally operate on any type of digital semiconductor chip, and is not limited to a CPU chip, and the semiconductor chip need not be in a computer system.

CPU 201 is coupled to memory 240. Memory 240 can include any type of volatile or non-volatile random access memory that stores code and data for CPU 201.

Computer system 200 also includes test controller 230. Test controller 230 includes circuitry to test semiconductor chip 201 by manipulating scan logic within semiconductor chip 201. Test controller 230 can include a dedicated circuit that controls the testing process or a service processor that performs testing and/or configuration functions for computer system 200.

A number of signals feed between test controller 230 and semiconductor chip 201, including test inputs 104, test clock signal 108, test mode signal 102, select test clock signal 105, begin test disable signal 214, end test disable signal 216, start scan signal 218 and test outputs 222.

Test inputs 104 include one or more inputs for shifting data into one or more scan chains within semiconductor chip 201. Test outputs 222 include one or more outputs for shifting data out of the one or more scan chains within semiconductor chip 201. Note that test inputs 104 and test outputs 222 can share signal lines with main inputs 203 and main outputs 220.

Test clock signal 108 is an alternative clock signal, which is used for testing purposes. Test controller 230 selects between main clock signal 106 and test clock signal 108 using select test clock signal 105.

Test mode signal 102 is used to switch the circuitry within semiconductor chip 201 between a test mode, in which the memory elements in a scan chain are connected into a long shift register, and a normal mode, in which the memory elements in the scan chain are configured for normal operation of semiconductor chip 201.

Test controller 230 asserts begin test disable signal 214 to disable circuitry within semiconductor chip 201 so that a test input can be shifted into semiconductor chip 201 without damaging circuitry within semiconductor chip 201. Conversely, test controller 230 asserts end test disable signal 216 to reenable the circuitry within semiconductor chip 201 so that a test involving the test input can be performed, or if testing is complete.

Test controller 230 asserts start scan signal 218 to start the process of scanning data into semiconductor chip 201 from test controller 230.

Circuitry to Restrict the Damaging Effects of Software Faults

Figure 3:
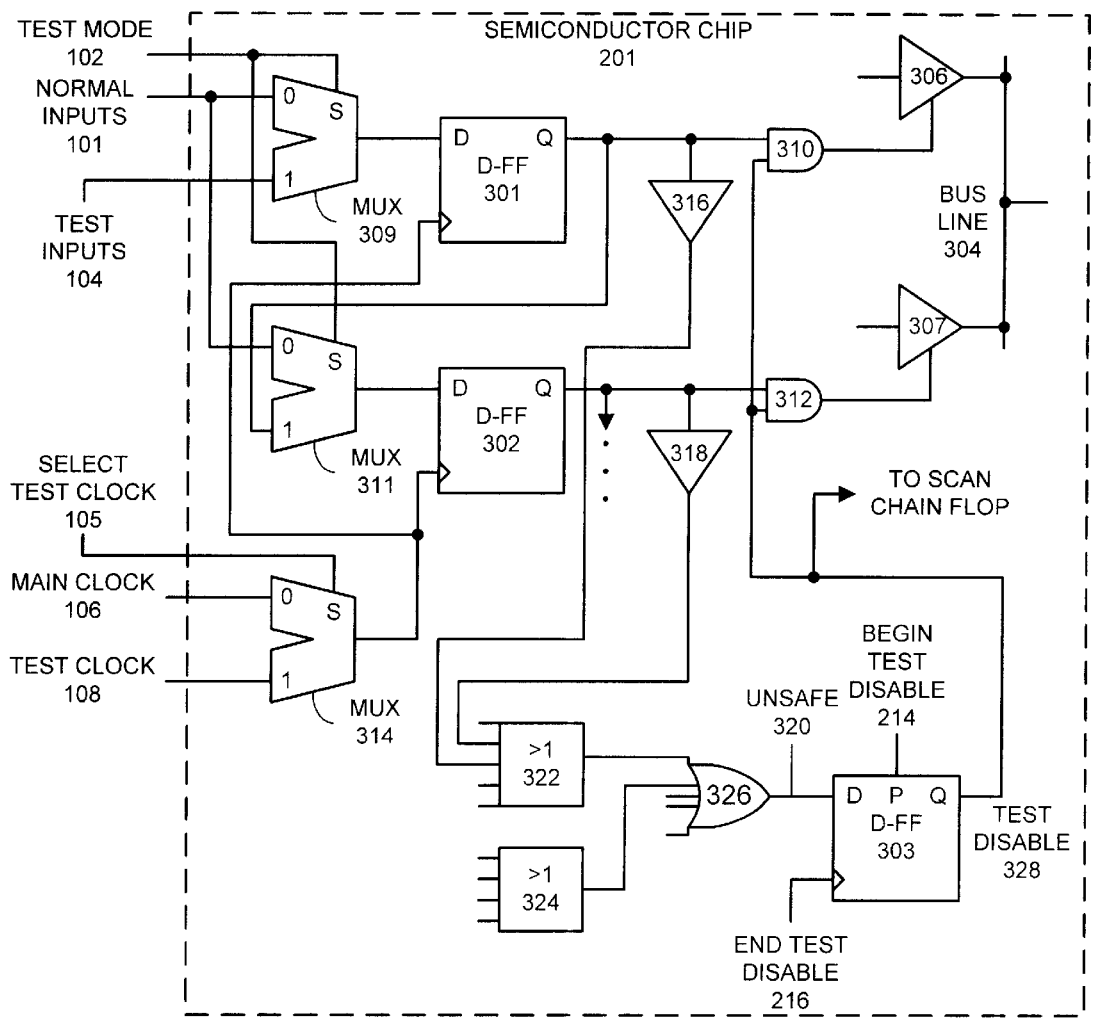
FIG. 3 illustrates circuitry that restricts the damaging effects of software faults that interact with scan test circuitry in accordance with an embodiment of the present invention.

FIG. 3 illustrates circuitry that restricts the damaging effects of software faults that interact with scan test circuitry in accordance with an embodiment of the present invention. This circuitry resides within semiconductor chip 201 from FIG. 2. This circuitry includes D-flip-flops (D-FFs) 301–302, which can be selectively coupled into a scan chain by MUX 309 and 311, respectively, by asserting test mode signal 102. Otherwise, D-FFs 301 and 302 are coupled to normal inputs 101 by MUX 309 and 311.

D-FFs 301–302 enable drivers 306–307, which drive bus line 304. Note that if both drivers 306 and 307 are active at the same time, it is likely that they will drive conflicting signals onto bus line 304, which can cause one of drivers 306 and 307 to become damaged.

Also note that D-FFs 301–302 can be selectively driven by test clock signal 108 or main clock signal 106 depending upon whether or not select test clock signal 105 is asserted. Select test clock 105 causes MUX 314 to select either main clock 106 or test clock 108.

The circuitry illustrated in FIG. 3 additionally includes circuitry to detect whether a test input will cause both drivers 306 and 307 to drive bus line 304 at the same time. This detection circuitry includes drivers 316 and 318, which drive the outputs of D-FFs 301 and 302 into majority circuit 322. Majority circuit 322 produces a high value if more than one of its inputs has a high value. The other inputs to majority circuit 322 are coupled to other enables for drivers on bus line 304. In this way, majority circuit 322 is able to determine if more than one driver is trying to drive bus line 304 at the same time. Enable signals associated with drivers for another bus line are coupled to majority circuit 324. Each bus line (or related set of bus lines) that can potentially have a bus conflict has its own majority circuit.

The outputs of all majority circuits, including majority circuits 322 and 324, feed into OR-gate 326. The output of OR-gate 326 is asserted whenever any bus line has a potential bus conflict, and is hence referred to as "unsafe signal" 320.

Unsafe signal 320 feeds into the D input of D-FF 303. The preset input of D-FF 303 takes in begin test disable signal 214. End test disable signal 216 feeds into the clock input of D-FF 303. The output of D-FF 303 is test disable signal 328, which feeds into AND-gates 310 and 312. In this way test disable signal 328 can deactivate the enables to drivers 306 and 307 in order to eliminate potential bus conflicts.

When begin test disable signal 214 is asserted, D-FF 303 is set. This causes drivers 306–307 to be disabled. When end test disable signal 216 is asserted, test disable signal 328 is reset to an unasserted value only if unsafe signal 320 is not set. Otherwise, if unsafe signal 320 is set, end test disable signal 216 will not load a zero into D-FF 303. Therefore, drivers 306 and 307 will only be enabled if they do not conflict. This protects drivers 306 and 307 from conflicting as scan data is shifted into D-FFs 301 and 302.

Note that the propagation delays along the signal lines from drivers 316 and 318 to majority circuit 322, and from D-FF 303 to AND-gates 310 and 312 can be very long because the signal lines may have to traverse large distances across semiconductor chip 201. However, these long propagation delays will not slow down the normal operating speed of the circuit because these propagation delays come into play only while the system is loading test inputs into the circuit.

Also note that test disable signal 328 is also coupled to a flip-flop in the scan chain. This allows the state of test disable signal 328 to be read out of the chip through the scan chain after testing is complete. If test disable signal 328 has a high value, this indicates that the circuit did not leave test disable mode during the test.

More Circuitry to Restrict the Damaging Effects of Software Faults

Figure 4:
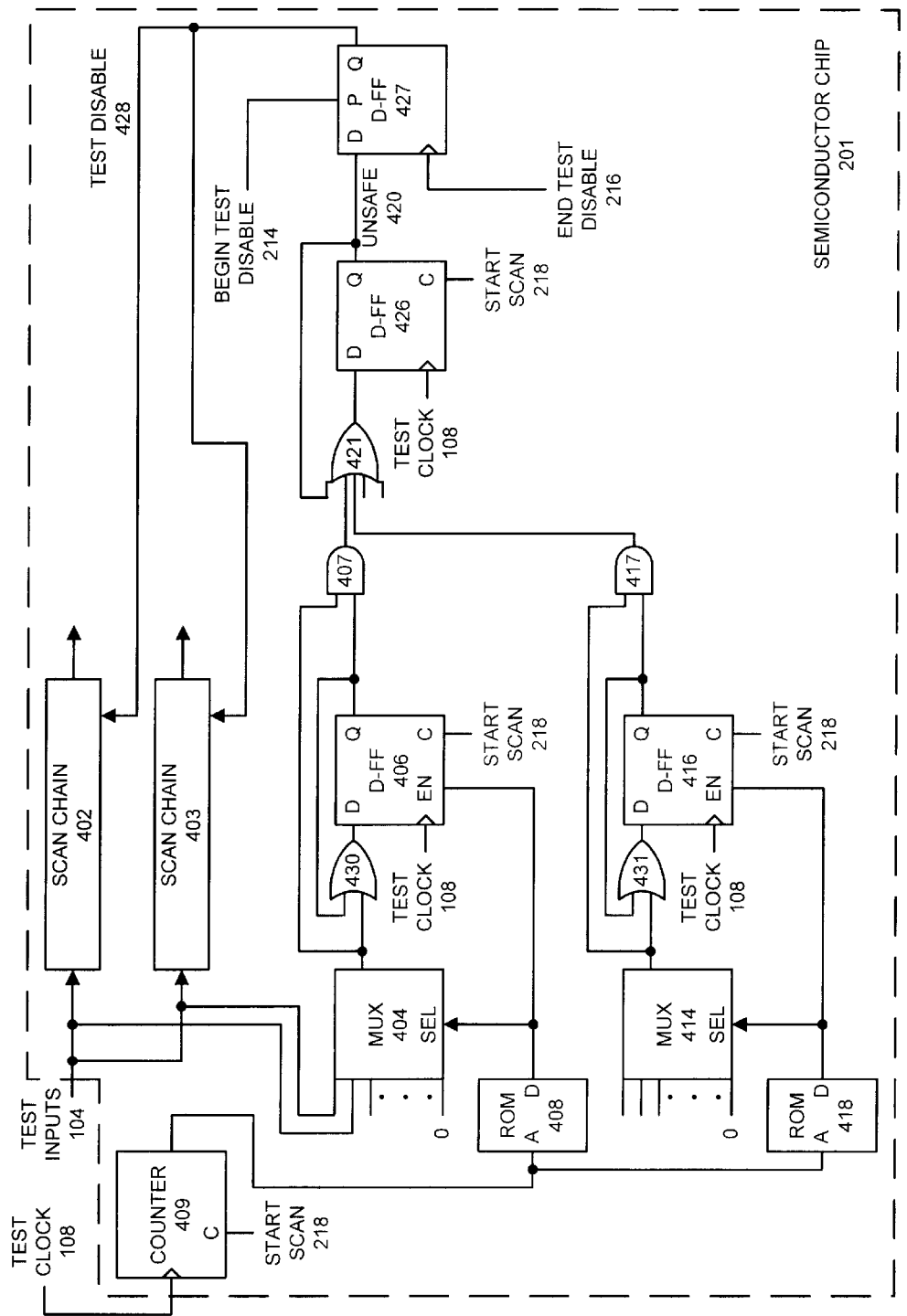
FIG. 4 illustrates circuitry that restricts the damaging effects of software faults that interact with scan test circuitry in accordance with another embodiment of the present invention.

FIG. 4 illustrates circuitry that restricts the damaging effects of software faults that interact with scan test circuitry in accordance with another embodiment of the present invention. Unlike the circuitry illustrated in FIG. 3, this circuitry does not require any long signal lines from flops in the scan chain to the circuit that determines whether there is an unsafe condition. Instead, the circuitry analyzes test inputs 104 as they enter scan chains 402–403.

More specifically, test inputs 104 from the head of scan chains 402–403 feed into multiplexer (MUX) 404. MUX 404 has an input for each scan chain in the circuit. This allows MUX 404 to select a particular bit from a particular scan chain to examine. The output of MUX 404 feeds through OR-gate 430 into D-FF 406. The other input of OR-gate 430 is received from the output of D-FF 406. Hence, whenever D-FF 406 becomes set during the process of shifting data into scan chains 402 and 403, it will remain set.

The output of D-FF 406 is ANDed with the output of MUX 404 using AND-gate 407. Hence, the output of AND-gate 407 will go high if the output of MUX 404 is high and D-FF 406 is set. This happens of any two bits that are examined from scan chains 402 and 403 are set, which can indicate a potential bus conflict.

The circuit illustrated in FIG. 4 examines particular bits from scan chains 402 and 403 that are associated with a first bus. The circuit examines these bits by using counter 409 to cycle through ROM 408. The outputs of ROM 408 specify different inputs to MUX 404 to select a particular scan chain to examine. Another output of ROM 408 selectively enables D-FF 406 so that D-FF 406 can record a particular bit in the selected scan chain that appears at the output to MUX 404. Note that if no scan chains are of interest during a specific clock cycle, ROM 408 causes MUX 404 to select an input that is tied to a low value. This prevents the output of AND-gate 407 from being asserted for bits that are not of interest.

An equivalent circuit exists for each bus with multiple drivers located on one of scan chains 402 and 403 within semiconductor chip 201. For example, circuitry for a second bus includes ROM 418, MUX 414, OR-gate 431, D-FF 416 and AND-gate 417. AND-gate 417 produces a high output more than one driver on the second bus are active at the same time.

The outputs of AND-gates 407 and 417 feed through OR-gate 421 into D-FF 426. OR-gate 421 takes an additional input from the output of D-FF 426. Hence, D-FF 426 will be set if any of the outputs of AND-gates 407 and 417 are asserted, or of D-FF 426 was previously set.

The output of D-FF 426 is unsafe signal 420, which indicates that it is unsafe to move the circuit out of test disable mode. Unsafe signal 420 feeds into the D input of D-FF 427. Begin test disable signal 214 feeds into the preset input of D-FF 427. End test disable signal feeds into the clock input of D-FF 427. The output of D-FF 427 is test disable signal 428, which feeds into scan chains 402 and 403 where it can activate drivers to eliminate potential bus conflicts.

When begin test disable signal 214 is asserted, D-FF 427 is set. This causes the drivers associated with scan chains 402–403 to be disabled. When end test disable signal 216 is asserted, test disable signal 428 is reset to an unasserted value only if unsafe signal 420 is not set. Otherwise, if unsafe signal 420 is set, end test disable signal 216 will not load a zero into D-FF 427, and will not move the circuit out of test disable mode.

Process of Restricting the Damaging Effects of Software Faults

Figure 5:
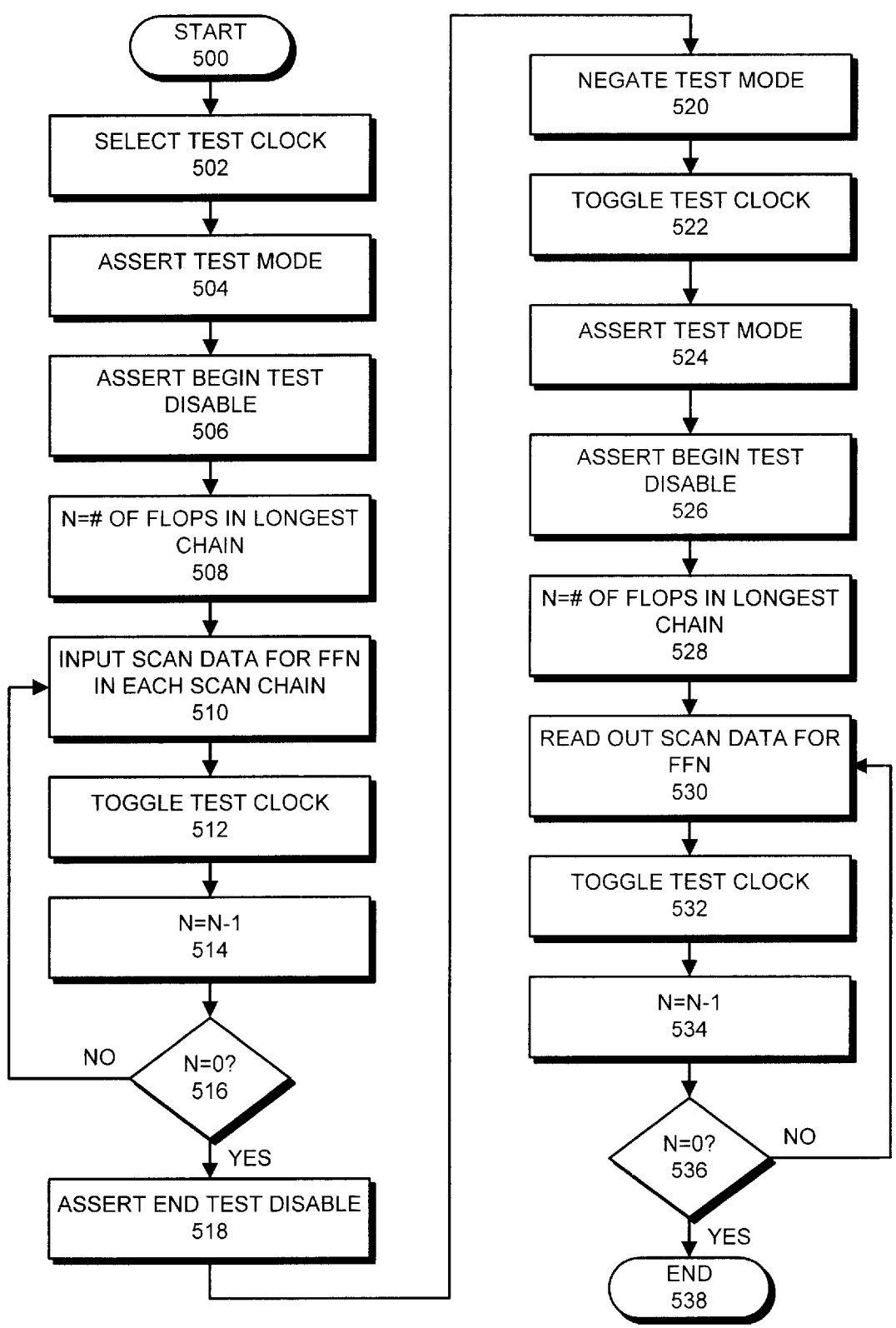
FIG. 5 is a flow chart illustrating the process of operating scan test circuitry in a manner that restricts the damaging effects of software faults in accordance with an embodiment of the present invention.

FIG. 5 is a flow chart illustrating the process of operating scan test circuitry in a manner that restricts the damaging effects of software faults in accordance with an embodiment of the present invention. The system starts by shifting scan data into scan chains within semiconductor chip 201. This involves asserting select test clock signal 105 to select the test clock signal 108 (step 502). It also involves asserting test mode signal 102 (step 504) and begin test disable signal 214 (step 506). The system additionally sets the counter N to equal the number of flops in the longest scan chain within semiconductor chip 201 (step 508).

The system inputs data for flip-flop N in each scan chain (step 510) and toggles test clock signal 108 to load the data (step 512). Next, the counter N is decremented (step 514) and compared with zero (step 516). If N is not equal to zero, the system returns to step 510 to input the next bit into each scan chain.

Otherwise, the system performs the test by asserting end test disable signal 216 (step 518) and negating test mode signal 102 (step 520). At this point the protection from the test disable mode will be removed if there are no bus conflicts or other unsafe conditions caused by the test input. The system then toggles test clock signal 108 for one or more clock cycles (step 522) to perform the test.

Next, the system shifts data out of the scan chains so that the results of the test can be examined. To do so, the system asserts test mode signal 102 (step 524) and begin test disable signal 214 (step 526). The system also sets the counter N to equal the number of flops in the longest scan chain (step 528). Next, the system reads out the data for flip-flop N in each scan chain (step 530) and toggles test clock signal 108 (step 532). The counter N is also decremented (step 534) and compared with zero (step 536). If N is not equal to zero, the system returns to step 530 to read out the next bit from each scan chain. Otherwise, the process is complete.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for restricting damaging effects of software faults that interact with test and configuration circuitry within a circuit, the test and configuration circuitry including a scan chain in the form of a serial linkage between memory elements within the circuit thereby allowing a test input to be serially shifted into the memory elements, the method comprising:

placing the circuit into a test disable mode, the test disable mode limiting damaging effects to the circuit caused by shifting the test input into the memory elements in the scan chain;

transferring the test input into the memory elements in the scan chain;

detecting within the test and configuration circuitry while the circuit is held in test disable mode before any testing has taken place, a bit pattern within the test input that will cause multiple drivers to drive a bus simultaneously causing damage to the circuit;

if the condition indicates that the bit pattern within the test input will cause damage to the circuit, holding the circuit in the test disable mode so that the test input cannot damage the circuit; and if the condition indicates that the test input will not cause damage to the circuit,
moving the circuit out of test disable mode, and
running the circuit for at least one clock cycle in order to test the circuit.

2. The method of claim 1, wherein detecting a condition indicative of whether the test input will cause damage to the circuit further comprises examining the test input as the test input is shifted into the scan chain using a state machine that looks for a pattern in the test input that will cause damage to the circuit after the test input is shifted into the scan chain.

3. The method of claim 1, wherein detecting a condition indicative of whether the test input will cause damage to the circuit further comprises examining the test input after the test input is shifted into the scan chain using a logic circuit that looks for a pattern in the scan chain that will cause damage to the circuit.

4. The method of claim 1, wherein the test disable mode. prevents more than one driver from driving a signal line at the same time in order to prevent conflicts between drivers.

5. The method of claim 1, further comprising after testing the circuit:

moving the circuit back into the test disable mode;

shifting a test output out of the scan chain; and examining the test output to determine how the circuit performed during the test.

6. The method of claim 5, wherein the scan chain includes a memory element that indicates whether the test input will cause damage to the circuit, so that upon examining the test output it can be determined whether the circuit moved out of the test disable mode during the test.

7. The method of claim 1, wherein the test disable signal and the test input are received from a test controller which is located outside of the circuit.

8. The method of claim 1, wherein running the circuit for at least one clock cycle includes running the circuit using one of a system clock and a test clock that is separate from the system clock.

9. The method of claim 1, wherein the circuit includes more than one scan chain.

10. The method of claim 1, wherein the circuit resides within a single semiconductor chip.

11. A method for restricting damaging effects of software faults that interact with test and configuration circuitry within a circuit that resides inside a single semiconductor chip, the test and configuration circuitry including a scan chain in the form of a serial linkage between memory elements within the circuit thereby allowing a test input to be serially shifted into the memory elements, the method comprising:

receiving a test disable signal at the circuit from a test controller which is located outside of the circuit;

in response to the test disable signal, moving the circuit into a test disable mode, the test disable mode limiting damaging effects to the circuit-caused by shifting the test input into the memory elements in the scan chain;

wherein the test disable mode prevents a pattern within the test input from causing more than one driver to drive a signal line at the same time in order to prevent conflicts between drivers;

shifting the test input into the memory elements in the scan chain;

determining within the test and configuration circuitry while the circuit is held in test disable mode before any testing has taken place whether a bit pattern within the test input will cause damage to the circuit after the test input is shifted into the scan chain;

if the bit pattern within the test input will cause damage to the circuit, holding the circuit in the test disable mode so that the test input cannot damage the circuit;

if the test input will not cause damage to the circuit,
moving the circuit out of test disable mode, and
running the circuit for at least one clock cycle in order to test the circuit;

moving the circuit back into the test disable mode;

shifting a test output out of the scan chain; and examining the test output to determine how the circuit performed during the test.

12. The method of claim 11, wherein determining whether the test input will cause damage to the circuit further comprises examining the test input as the test input is shifted into the scan chain using a state machine that looks for a pattern in the test input that will cause damage to the circuit after the test input is shifted into the scan chain.

13. The method of claim 11, wherein determining whether the test input will cause damage to the circuit further comprises examining the test input after the test input is shifted into the scan chain using a logic circuit that looks for a pattern in the scan chain that will cause damage to the circuit.

14. An apparatus that restricts damaging effects of software faults that interact with test and configuration circuitry within a circuit, comprising:
   a scan chain in the form of a serial linkage between memory elements within the circuit, the scan chain allowing a test input to be serially shifted into the memory elements;
   a scan chain data input on the circuit through which the test input is shifted into the memory elements in the scan chain;
   a damage assessment circuit within the circuit that determines while the circuit is held in test disable mode before any testing has taken place whether a bit pattern within the test input will cause damage to the circuit after the test input is shifted into the scan chain by causing multiple drivers to drive the same bus simultaneously; and
   a testing circuit that is configured,
      to disable the circuit so that the test input cannot damage the circuit if the test input will cause damage to the circuit, and
      to test the circuit if the test input will not cause damage to the circuit by running the circuit for at least one clock cycle.

15. The apparatus of claim 14,
   wherein the damage assessment circuit is configured to examine the test input as the test input is shifted into the scan chain; and
   wherein the damage assessment circuit includes a state machine that looks for a pattern in the test input that will cause damage to the circuit after the test input is shifted into the scan chain.

16. The apparatus of claim 14,
   wherein the damage assessment circuit is configured to examine the test input after the test input is shifted into the scan chain; and
   wherein the damage assessment circuit includes a logic circuit that looks for a pattern in the scan chain that will cause damage to the circuit.

17. The apparatus of claim 14, wherein disabling of the circuit prevents more than one driver from driving a signal line at the same time in order to prevent conflicts between drivers.

18. The apparatus of claim 14, wherein the testing circuit is further configured to:
   shift a test output out of the scan chain; and to
   examine the test output to determine how the circuit performed during the test.

19. The apparatus of claim 18, wherein the scan chain includes a memory element that indicates whether the test input will cause damage to the circuit, so that upon examining the test output it can be determined whether the circuit was disabled during the test.

20. The apparatus of claim 14, further comprising a test controller located outside the circuit that asserts a test disable signal as an input to the circuit and feeds the test input into the scan chain.

21. The apparatus of claim 14, wherein running the circuit for at least one clock cycle includes running the circuit using one of a system clock and a test clock that is separate from the system clock.

22. The apparatus of claim 14, wherein the circuit includes more than one scan chain.

23. The apparatus of claim 14, wherein the circuit resides within a single semiconductor chip.

24. A computer system that restricts damaging effects of software faults that interact with test and configuration circuitry within a circuit in the computer system, comprising:
   a processor;
   a memory;
   a circuit on a semiconductor chip within the computer system;
   a scan chain in the form of a serial linkage between memory elements within the circuit, the scan chain allowing a test input to be serially shifted into the memory elements;
   a scan chain data input through which the test input is shifted into the memory elements in the scan chain;
   a test disable input on the circuit for receiving a test disable signal;
   a test disable circuit that upon receiving the test disable signal moves the circuit into a test disable mode, the test disable mode limiting damaging effects to the circuit caused by shifting the test input into the memory elements in the scan chain;
   a damage assessment circuit within the circuit that determines while the circuit is held in test disable mode before any testing has taken place whether a bit pattern within the test input will cause damage to the circuit after the test input is shifted into the scan chain by causing multiple drivers to drive the same bus simultaneously;
   a testing circuit that is configured to,
      hold the circuit in the test disable mode so that the test input cannot damage the circuit if the test input will cause damage to the circuit, and to
      test the circuit if the test input will not cause damage to the circuit by, moving the circuit out of test disable mode, and running the circuit for at least one clock cycle; and
   a test controller located outside the circuit that asserts the test disable signal and feeds the test input into the scan chain.

25. A method of operating a circuit in a test mode comprising:
   receiving test data;
   allowing the circuit to run in the test mode for at least one clock cycle using the test data;
   monitoring the circuit while the circuit is held in test disable mode before any testing has taken place for the occurrence of a condition that might damage the circuit, wherein the condition includes a bit pattern within the test data that will cause multiple drivers to drive a bus simultaneously; and
   if the bit pattern is detected, holding the circuit in a first state in which the test data cannot damage the circuit.

26. The method of claim 25 wherein the monitoring of the circuit is done as the test data are input into the circuit.

27. The method of claim 25 wherein the monitoring of the circuit is done using a state machine to detect the occurrence of the condition.

28. The method of claim 25 wherein the monitoring of the circuit is done after the test data have been input into the circuit.

29. A circuit comprising:

test circuitry configured to test the operation of the circuit;

at least one test data input for receiving test data to be used by the test circuitry;

monitoring circuitry coupled to the test circuitry and the at least one test data input for detecting while the circuit is held in test disable mode before any testing has taken place, a condition of the test data that could cause damage to the circuit, wherein the condition includes a bit pattern within the test data that will cause multiple drivers to drive a bus simultaneously; and disabling circuitry coupled to the monitoring circuitry for disabling the operation of the test circuitry when the bit pattern is detected.

* * * * *